United States Patent
Nomaguchi

(10) Patent No.: US 7,103,081 B2
(45) Date of Patent: Sep. 5, 2006

(54) DFB LASER WITH AR COATING SELECTED TO PROVIDE WIDE TEMPERATURE RANGE OF OPERATION

(75) Inventor: Toshio Nomaguchi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 271 days.

(21) Appl. No.: 10/686,518

(22) Filed: Oct. 16, 2003

(65) Prior Publication Data

US 2005/0018741 A1    Jan. 27, 2005

(30) Foreign Application Priority Data

Oct. 18, 2002  (JP) ............................. 2002-304696

(51) Int. Cl.
*H01S 5/00*    (2006.01)
*H01S 3/08*    (2006.01)

(52) U.S. Cl. ................. 372/49.01; 372/50.11; 372/96; 372/102

(58) Field of Classification Search ............. 372/49.01, 372/50.11, 96, 99, 102
See application file for complete search history.

(56) References Cited

U.S. PATENT DOCUMENTS

| 6,289,030 B1 | 9/2001 | Charles |
| 6,556,607 B1* | 4/2003 | Jewell ..................... 372/49.01 |
| 6,804,282 B1* | 10/2004 | Shigihara et al. ........ 372/49.01 |
| 6,952,437 B1* | 10/2005 | Bettiati et al. ................. 372/92 |
| 2004/0013144 A1* | 1/2004 | Kise et al. ..................... 372/45 |

FOREIGN PATENT DOCUMENTS

| JP | 07-170016 | 7/1995 |
| JP | 09-107156 | 4/1997 |
| JP | 9-326531 | 12/1997 |
| JP | 10-51072 | 2/1998 |
| JP | 10-190139 | 7/1998 |
| JP | 10-303495 | 11/1998 |

OTHER PUBLICATIONS

Mitsuo Fukuda, "Reliability and Degradation of Semiconductor Lasers and LEDs", dated Nov. 14, 2003 pp. 72-76.
Japanese Office Action and English language translation dated Jun. 28, 2005.

* cited by examiner

*Primary Examiner*—Minsun Harvey
*Assistant Examiner*—Marcia A. Golub
(74) *Attorney, Agent, or Firm*—Smith, Gambrell & Russell, LLP

(57) ABSTRACT

This invention provides a semiconductor laser that enables to oscillate at a wavelength defined by a Bragg grating formed therein in a wide temperature range without any temperature-controlling. The semiconductor laser comprises an active region and the Bragg grating formed with the active region. A light-emitting surface and a light-reflecting surface are formed so as to sandwiches the active region. The light-emitting surface has an anti-reflective coating, the reflectivity of which is so adjusted that the minimum thereof is at the wavelength where the gain attributed to the FP modes is the maximum and is smaller than 0.3%.

10 Claims, 10 Drawing Sheets

DFB LASER WITH AR COATING SELECTED TO PROVIDE WIDE TEMPERATURE RANGE OF OPERATION

BACKGROUND OF THE INVENTION

1. Field of the Invention

The present invention relates to a semiconductor laser, especially relates to a semiconductor laser with a grating.

2. Related Prior Art

In the optical fiber communication, particularly in the long reach and high-speed field, semiconductor lasers with a grating has been used. Such semiconductor lasers are a distributed feedback laser (DFB laser), a distributed Bragg reflector laser (DBR laser) and a laser with an external cavity A configuration and mechanism of the DFB laser are well known to various articles, such as a specification of Japanese Patent laid open 10-051072. The DFB laser provides a light-reflecting surface and a light-emitting surface with relatively low reflectivity to the light-reflective surface. A Bragg grating is disposed between the light-reflecting surface and the light-emitting surface. A relatively high reflective coating on the light-reflecting surface and an anti-reflective coating on the light-emitting surface are disclosed in Japanese Patent laid open 10-190139 and also Japanese Patent laid open 09-326531, respectively.

An optical module including the DFB laser generally provides a thermo-electric element, such as Peltier element, to keep the temperature of the DFB laser constant. In such optical module with the Peltier element, even the ambient temperature change, the practical temperature of the DIB laser may be kept constant through the Peltier element, thereby enabling to output light in single mode.

On the other hand, to install the Peltier element within the optical module results in raising cost of the module due to the increase of parts and assembly process. Similarly, power consumption of the module increases due to current supplied to the Peltier element. The conventional DFB lasers without any Peltier element oscillate in numerous Fabry-Perot mode at low temperatures around −40° C. because the gain attributed to the Fabry-Perot mode superiors to that of the DFB mode at low temperature.

SUMMARY OF THE INVENTION

The present invention is to solve the above described problem that the DFB laser without any temperature-controlling element will oscillate in numerous FP mode at low temperature, and to provide an optical module with the DFB laser oscillating in unique single BG mode at low temperature without any temperature controlling-element.

According to the present invention, a semiconductor laser of a DFB type, which emits light with plural Fabry-Perot mode and a Bragg grating mode, comprises an active region made of a semiconductor material, a Bragg grating for defining the Bragg grating mode, a light-reflecting surface and a light-emitting surface providing with an anti-reflective coating. The light emitting surface and the light-reflecting surface sandwiches the active region and the Bragg grating therebetween, and defines a Fabry-Perot resonator combined with the active region for defining the plural Fabry-Perot modes.

One aspect of the present invention, the reflectivity of the light-emitting surface with the anti-reflective coating has minimum at a wavelength where a gain spectrum attributed to the Fabry-Perot modes is the maximum.

Since the light-emitting surface with the anti-reflective coating is so adjusted that the reflectivity thereof is minimum at the specific wavelength where the gain spectrum attributed to the Fabry-Perot modes is maximum, an optical loss within the Fabry-Perot cavity at the specific wavelength may increase, whereby suppresses the gain attributed to the Fabry-Perot mode relatively to the Bragg grating mode. Therefore, the laser may oscillate in unique Bragg grating mode at a whole operating-temperature range.

Another aspect of the present invention, the active region is made of semiconductor material for generating luminescence and the reflectivity of the light-emitting surface with the anti-reflective coating has a minimum at a predetermined wavelength smaller than a specific wavelength at which a magnitude of the luminescence is maximum at a room temperature. More specifically, the reflectivity of the light-emitting surface has the minimum at 45 nm smaller than the specific wavelength at a room temperature.

Since the reflectivity of the light-emitting surface is so adjusted that the minimum thereof coincides with the wavelength 45 nm smaller than the specific wavelength for the luminescence from the active region, the optical loss of the Fabry-Perot cavity at low temperatures may increase, which suppresses the gain attributed to the Fabry-Perot modes relatively to the gain of the Bragg grating mode, whereby the laser may oscillate at unique Bragg grating mode in whole operating-temperature.

Figure 7:
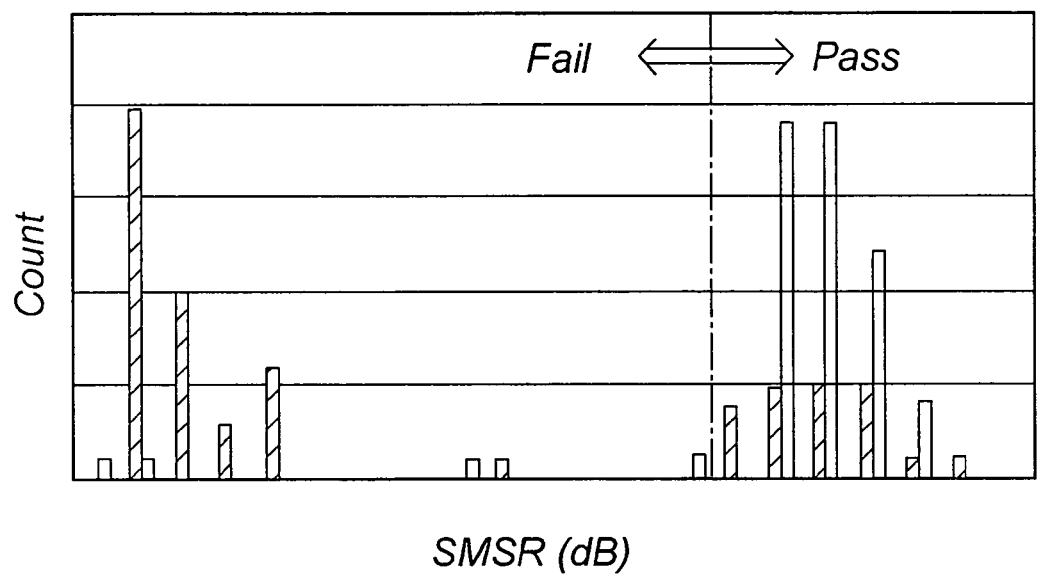
Figure 8:
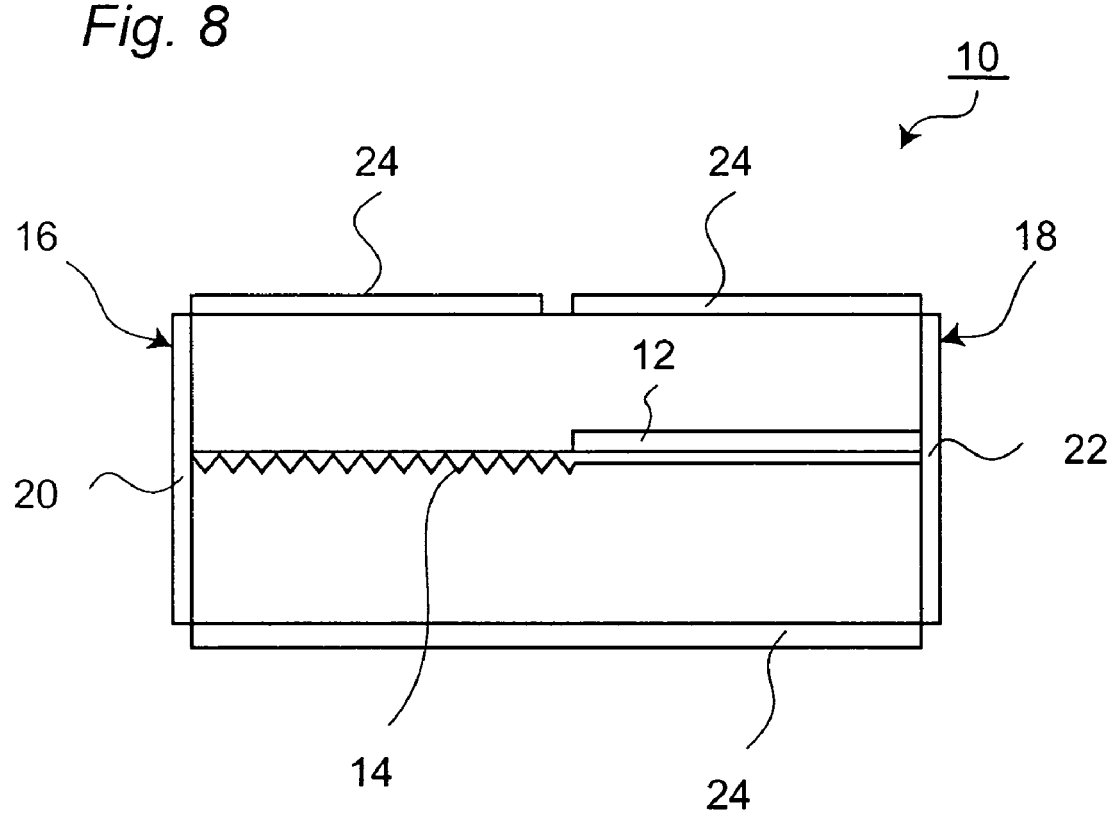
Figure 9:
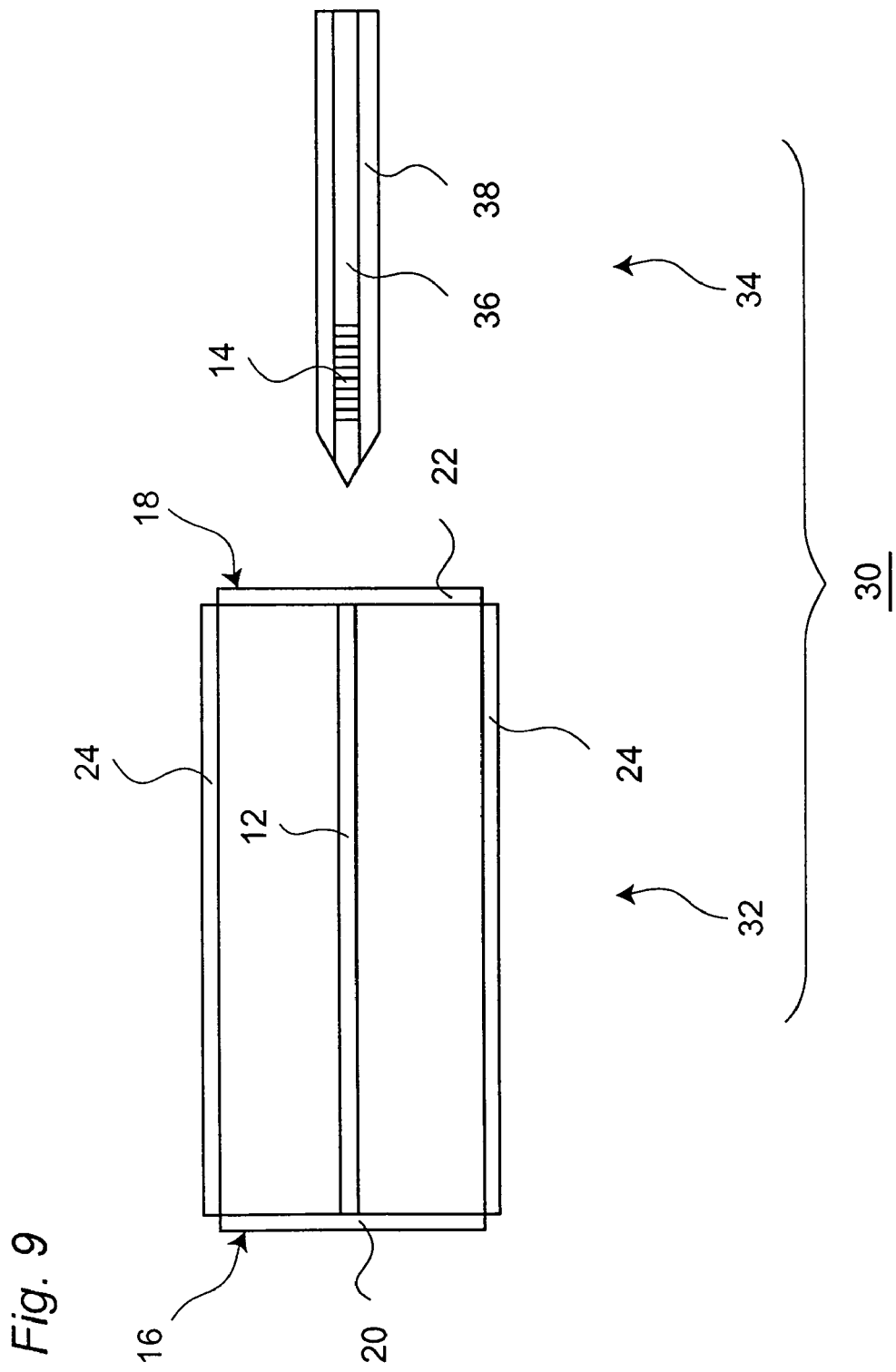
Figure 10:
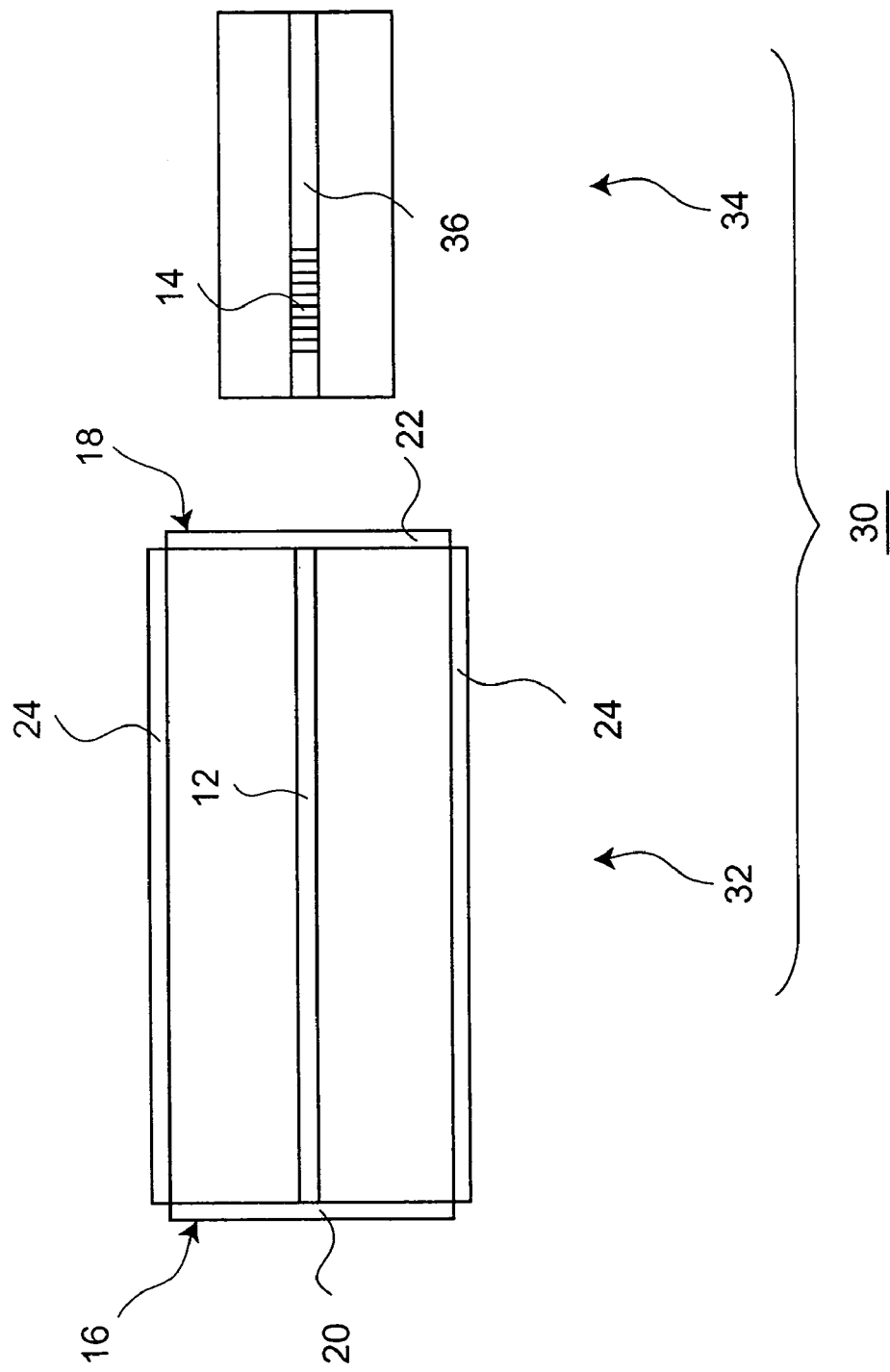

From FIG. 5A to FIG. 5C show oscillation spectrums of the DFB laser according to the present invention at −40° C., 25° C. and 85° C., respectively;

From FIG. 6A to FIG. 6C show oscillation spectrums of the conventional DFB laser at −40° C., 25° C. and 85° C., respectively;

FIG. 7 is a histogram of the SMSR testing for the DFB laser with the configuration of the present invention and that of the conventional configuration;

FIG. 8 is a schematic view showing the DBR laser having the configuration of the present invention;

FIG. 9 is a schematic view showing one embodiment having an external cavity formed by the grating fiber; and FIG. 10 is a schematic view showing another embodiment having an external cavity formed by the planar waveguide with a grating.

DETAILED DESCRIPTION OF THE INVENTION

Preferred embodiments of the present invention will be described in detail as referring to accompanying drawings. In the drawings, Elements identical to each other will be referred to with numerals identical to each other without overlapping explanations.

Figure 1:
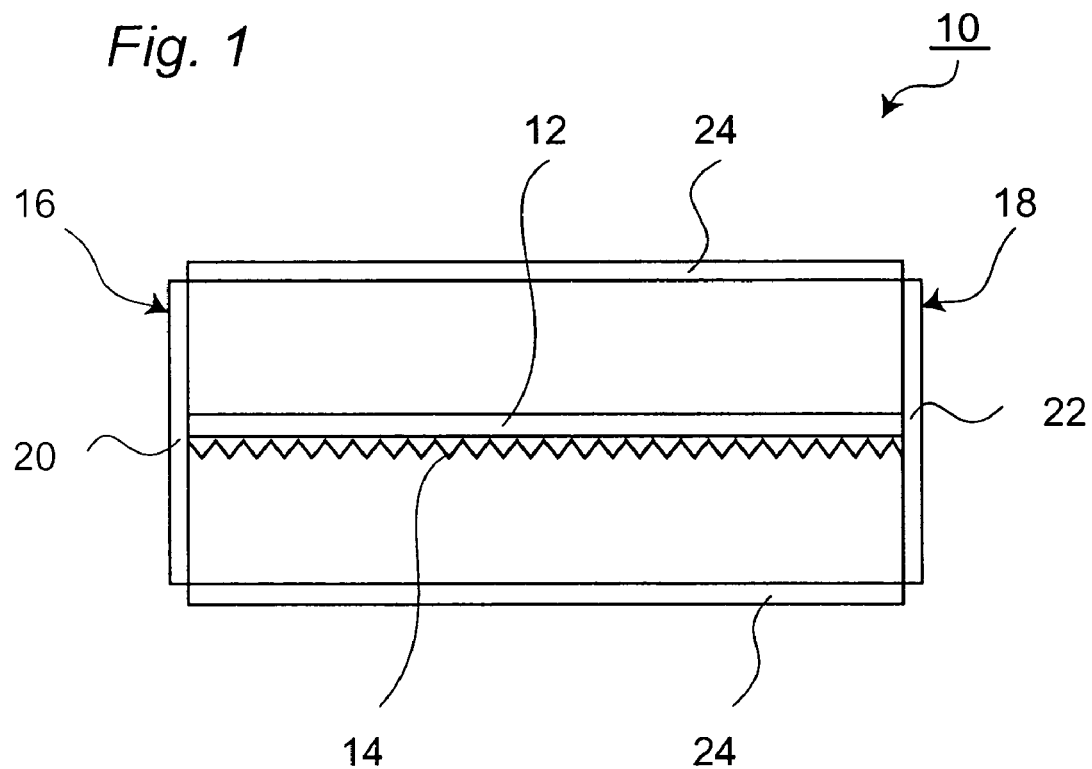
FIG. 1 is a schematic diagram showing a cross sectional of the DFB laser.

FIG. 1 is a schematic view showing a cross section of a semiconductor laser according to the present invention. The semiconductor laser 10 in FIG. 1 is used in a wavelength band from 1200 nm to 1625 nm and called as distributed feedback laser, hereinafter denoted as "DFB" laser. The DFB laser 10 comprises an active region 12, a Bragg grating 14, a light-reflecting surface 16, a light-emitting surface 18 and a pair of electrodes 24.

The active region 12 is made of a group III–V compound semiconductor material, such as GaInAsP, which generates luminescence with a maximum magnitude at a specific wavelength. Composition of the semiconductor material is so adjusted that the light generated therein has a predetermined wavelength.

The Bragg grating 14 is provided adjacent to the active region 12. Assuming a pitch and an effective refractive index of the Bragg grating are $\Lambda$ and $n_{eff}$, respectively, light with a wavelength $\lambda_{BG}=2 \cdot n_{eff} \cdot \Lambda$, which is called as the Bragg grating mode, is selectively emitted from the light-emitting surface 18.

The light-reflecting surface 16 is provided in a rear facet of the semiconductor laser with a high-reflective coating 20 thereon formed by multi-layered dielectric films, for example a combination of a amorphous silicon ($\alpha$-Si) and a silicon-nitride (SiN) stacked alternatively. The reflectivity of the light-reflection surface 16 with such high-reflective coating 20 is greater than 80%.

The light-emitting surface 18 is provided, with an anti-reflective coating 22, in a front facet opposing to the light-reflecting surface 16 to form an optical resonator therebetween. The anti-reflective coating 22 is so adjusted that the reflectivity of the light-emitting surface 18 becomes the minimum at a wavelength $\lambda_{FP}$ where a gain attributed to Fabry-Perot modes (hereinafter denoted by FP-mode) is the maximum at a predetermined temperature. The practical reflectivity is set to be below 0.3%, preferably smaller than 0.1%.

Such anti-reflective coating 22 may be made of multi-layered dielectric film. Typical combination of such multi-layered films are $Al_2O_3/TiO_2$, $SiO_2/TiO_2$, $Al_2O_3/Ta_2O_5$, $SiO_2/Ta_2O_5$ and $\alpha$-Si/$Al_2O_3$, they are formed by the IAD (Ion-Assisted Deposition) method and the ECR-CVD (Electron Cyclotron Resonance Plasma Chemical Vapor Deposition) method.

The FP-mode is defined by a length of an optical resonator formed between the light-emitting surface 16 and the light-reflecting surface 18 of the semiconductor laser 10. An interval between respective FP-mode is denoted as follows by the condition that a standing wave of light exists within the resonator, $$\Delta\lambda = \frac{\lambda^2}{2 \cdot n_{eff} \cdot L} \qquad (1)$$

where L is the length of the resonator and $n_{eff}$ is an effective refractive index of a medium within the resonator. When the laser emits light with a wavelength about 1.55 µm and the length of the resonator is 0.5 mm, the laser is capable of oscillating at innumerable FP-modes each having an interval of $\Delta\lambda$~0.44 nm. Moreover, respective FP-modes have a finite gain for the laser oscillation, which depends intrinsically on a material of the active region and on a reflectivity of both surfaces of the resonator. The laser may oscillate at wavelengths where the condition of the FP-modes is satisfied and the gain has a finite value.

Moreover, the DFB laser may oscillate at a Bragg grating mode (hereinafter denoted by BG-mode) independently of the FP-modes. The BG-mode, the wavelength of which is denoted by $\lambda_{BG}$, is determined by the configuration of the Bragg grating 14, namely, the pitch $\Lambda$ and the effective refractive index of the Bragg grating 14. In the DFB laser, the BG-mode is especially called by the DFB mode.

In the semiconductor laser 10 according to the present invention, the wavelength $\lambda_{BG}$ of the BG-mode, at room temperatures, is preferably greater than the wavelength $\lambda_{FP}$ at which the gain spectrum of the FP-modes, which is an envelope of respective FP-modes, is the maximum. Accordingly, the semiconductor laser 10 emitting light at unique longitudinal mode, that is, the BG-mode defined solely by Bragg grating 14, without any temperature adjusting means can be obtained.

Figure 2:
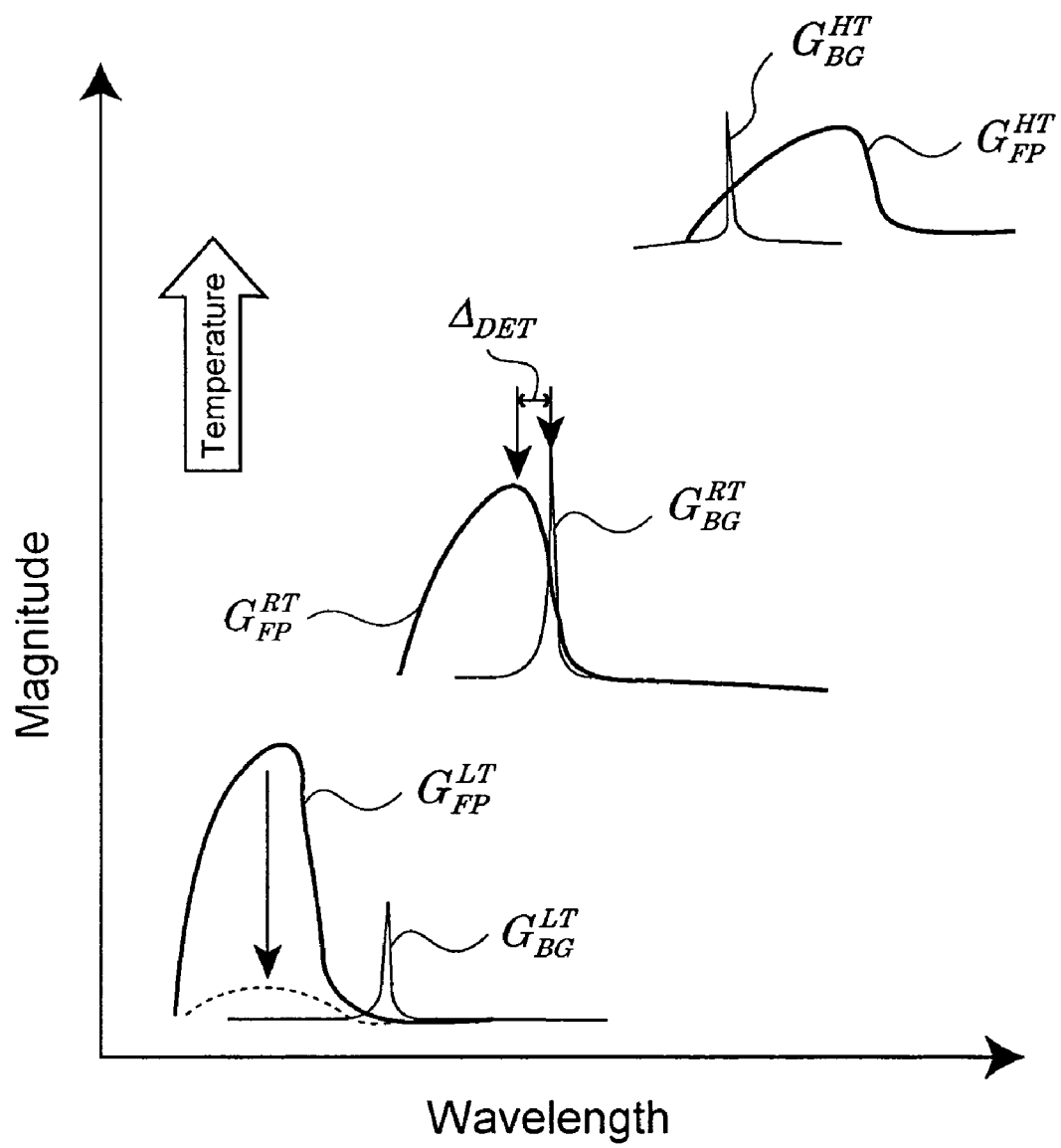
FIG. 2 shows relations between the gain spectrum attributed to the Fabry-Perot mode and that of the Bragg grating mode at a room temperature, a low temperature, and a high temperature.

Next, a mechanism of the present invention will be described in detail as referring to FIG. 2. FIG. 2 schematically shows a relation between the gain spectrum attributed to the FP-mode and that of the-BG mode at a low temperature (LT) shown in the lower left, at a room temperature (RT) in the center, and at a high temperature in the upper right partial view. These temperatures exemplary corresponds to −40° C., 25° C. and 85° C., respectively. In FIG. 2, it is easily understood that the wavelengths $\lambda_{FP}$ of the FP-mode and that of the BG-mode, $\lambda_{BG}$, have different temperature dependence. Namely, the wavelengths $\lambda_{FP}$ and $\lambda_{BG}$ shift to longer side as the temperature increase. The amount of the shift of the FP-mode is about 0.4 nm/° C., which is greater than that of the BG mode, 0.1 nm/° C.

In the room temperature RT, the gain attributed to the BG-mode is greater than the maximum gain attributed to the FP-modes, whereby the laser can oscillate in unique BG-mode at $\lambda_{BG}$. In order to oscillate the laser in single mode defined solely by the BG-mode in whole operating-temperature, it must be required that the gain attributed to the BG-mode is greater than the maximum gain attributed to the FP-modes.

However, in the conventional DFB laser, the maximum gain attributed to the FP-modes becomes greater than the gain to the BG-mode at the low temperature LT. While, the laser 10 according to the present invention, since the light-emitting surface is set such that the reflectivity thereof has a minimum, below 0.3% in the present invention, at the wavelength where the gain spectrum attributed to the FP-modes is the maximum, an optical loss of the FP modes at the light-reflecting surface 18 becomes large, which reduces gain of the FP-modes as denoted by a dotted line in the lower left view of FIG. 2, thereby enabling the single mode operation at the BG-mode.

Moreover, it is preferable in the semiconductor laser that, at the room temperature, the wavelength of the BG mode, $\lambda_{BG}$, is greater than the wavelength $\lambda_{FP}$, where the gain of the FP-modes is the maximum. Assuming a de-tuning $\Delta_{DET}$ is a difference between these wavelength, namely;

$$\Delta_{DET}=\lambda_{BG}-\lambda_{FP} \qquad (2),$$

According to another aspect of the present invention, the de-tuning may be determined such that a wavelength difference between both modes $\lambda_{BG}-\lambda_{FP}$ at extreme temperatures LT and HT within operating-temperatures does not exceed respective maximum de-tuning amount $\Delta\lambda_{LT}$ and $\Delta\lambda_{HT}$, which are ceiling conditions that the laser can oscillate. Once the de-tuning exceeds these conditions, the laser can not oscillate because of increasing the threshold current.

Figure 3:
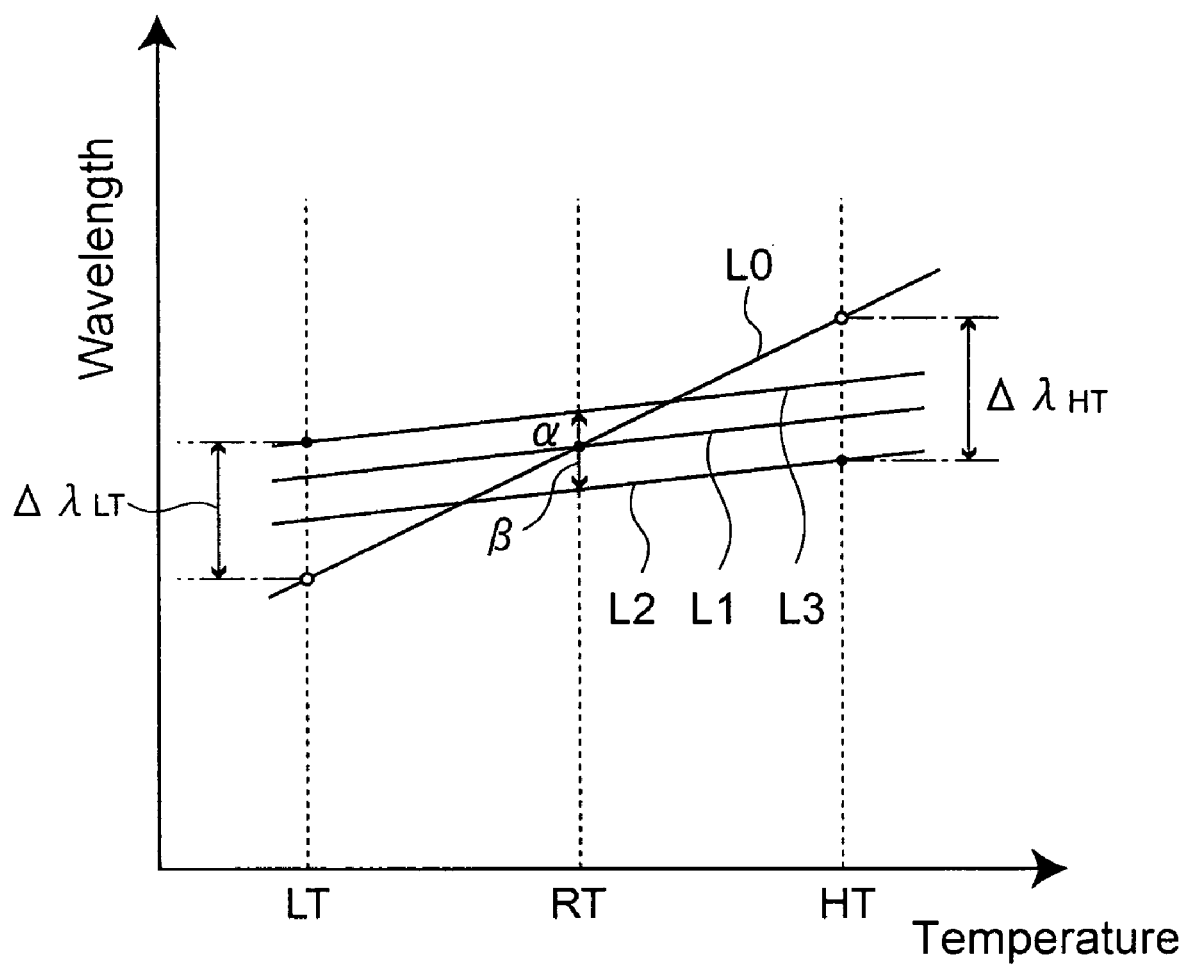
FIG. 3 shows a temperature dependence of wavelengths $\lambda_{FP}$ and $\lambda_{BG}$ at which the gain attributed to the Fabry-Perot mode and that of the Bragg grating mode are the maximum, respectively.

The mechanism of the de-tuning will be described as referring to FIG. 3. The line $L_0$ in FIG. 3 shows a temperature dependence of the wavelength $\lambda_{FP}$ where the gain spectrum attributed to the FP-modes is the maximum, while the lines $L_1$, $L_2$ and $L_3$ are the temperature dependence of the wavelength $\lambda_{BG}$. The lines L1, L2 and L3 correspond to the case that the de-tuning $\Delta_{DET}$ at the room temperature is equal to zero, negative amount β, and positive amount α, respectively. In the case that the de-tuning is negative β at the room temperature RT, the difference of the peak wavelength of the FP-mode and the BG-mode at the high temperature HT reaches the ceiling de-tuning condition $\Delta\lambda_{HT}$, while the case for the line L3, which is the positive de-tuning α at the room temperature, becomes the ceiling condition $\Delta\lambda_{LT}$ at the low temperature LT. Setting the de-tuning at the room temperature RT from minus β to plus α, the unique BG-mode oscillation can be obtained in the whole operation temperature range. When the operation temperature range is from −45° C. to +80° C., the ceiling de-tuning condition ΔLT and ΔHT generally do not exceed 22 nm. Therefore, the de-tuning $\Delta_{DET}$ is preferably to be from −10 nm to +8 nm taking the threshold current of the laser into account. Further, when the de-tuning is deep negative, from −10 nm to −7 nm, the I-L characteristic of the laser may deteriorate, namely, the increase of the threshold current and the decrease of the efficiency of the optical output. Accordingly, the de-tuning $\Delta_{DET}$ is preferably between −7 nm to +8 nm at the room temperature from the viewpoint of the I-L characteristic at high temperature.

In the coarse wavelength division multiplex (CWDM) communication using an optical fiber, the DFB laser with longer output wavelength greater than 1580 nm is used. The DFB laser with the de-tuning to a greater positive amount at the room temperature may enhance the performance at high temperatures. However, the positive de-tuning laser simultaneously deteriorates the sub-mode suppression ratio (SMSR) due to the increase of the gain attributed to the FP-mode at low temperatures. According to the present invention, even in such DFB laser, the unique longitudinal BG-mode oscillation can be obtained at low temperatures because the light-emitting surface provides the anti-reflective coating with the minimum reflectivity below 0.3% at the wavelength where the gain of the FP modes is the maximum.

Next, an embodiment of the present invention will be described. The laser according to the embodiment may operate at temperatures from −40° C., to +85° C. and the specific wavelength $\lambda_{BG}$ at which the gain attributed to the BG-mode at room temperature is 1590 nm.

Figure 4:
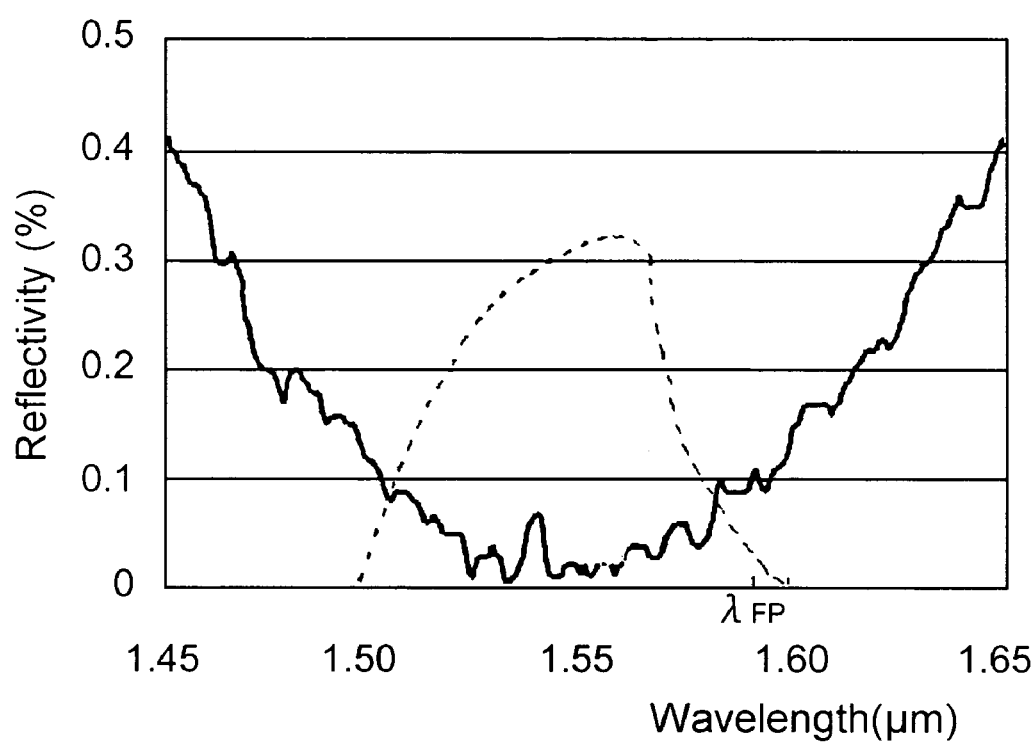
FIG. 4 shows a reflectivity of the light-emitting surface of one embodiment.

The active region 12 has the multi-quantum well structure made of GaInAsP and the maximum gain attributed to the FP-mode is 1588 nm. The pitch Λ of the Bragg grating 14 is set such that the wavelength of the BG-mode $\lambda_{BG}$ is 1590 nm. Therefore, the de-tuning becomes +2 nm at room temperature. The reflectivity of the light-emitting surface 18 with the anti-reflective coating 22 has a spectrum shown in FIG. 4, namely, the minimum reflectivity is 0.05% at 1543 nm, which is 45 nm below the a wavelength $\lambda_{FP}$ at which the gain spectrum of the FP-modes is the maximum at the room temperature. The multi-layered dielectric film of 180 nm thick $Al_2O_3$ and 50 nm thick $TiO_2$ both formed by the IAD method can realize such anti-reflective coating. A dotted line in FIG. 4 denotes the gain spectrum attributed to the FP modes at −40° C. The reflectivity of the light-emitting surface with the anti-reflective coating can be evaluated by, for example, the optical output power due to respective FP-modes and its ratio from the light-emitting surface 18 to that from the light-reflecting surface 16.

Figure 5:
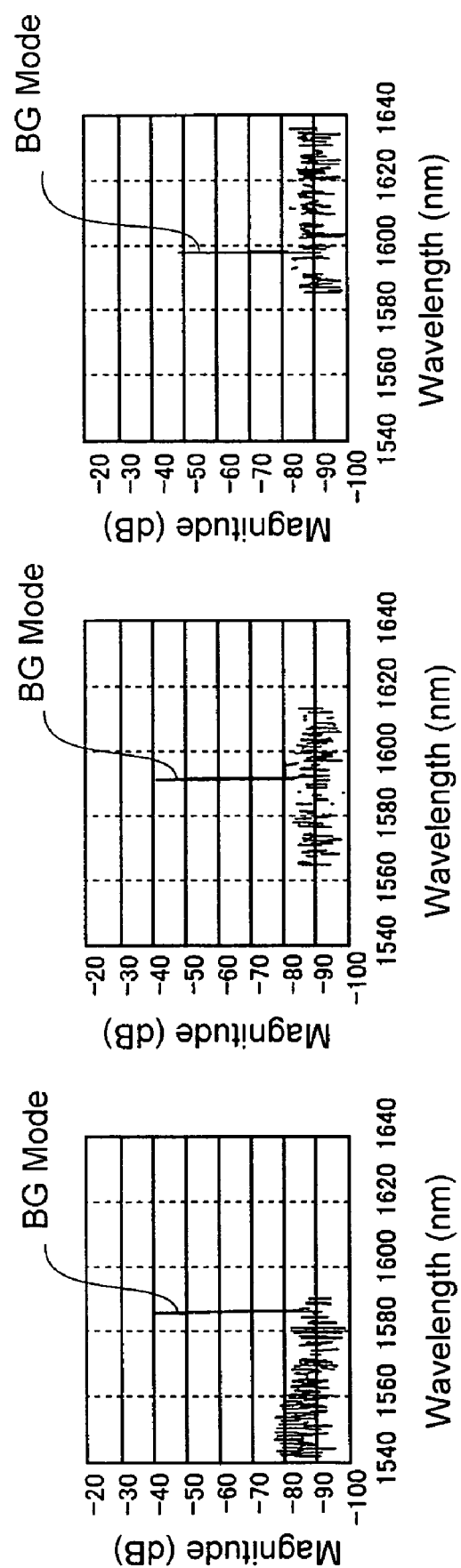

FIGS. from 5A to 5C show the oscillation spectrums of the semiconductor laser 10 at −40° C., 25° C. and 85° C., respectively. As shown in FIG. 5, the semiconductor laser 10 according to the present invention can oscillate in unique BG-mode at any temperatures from −40° C. to 85° C.

Figure 6:
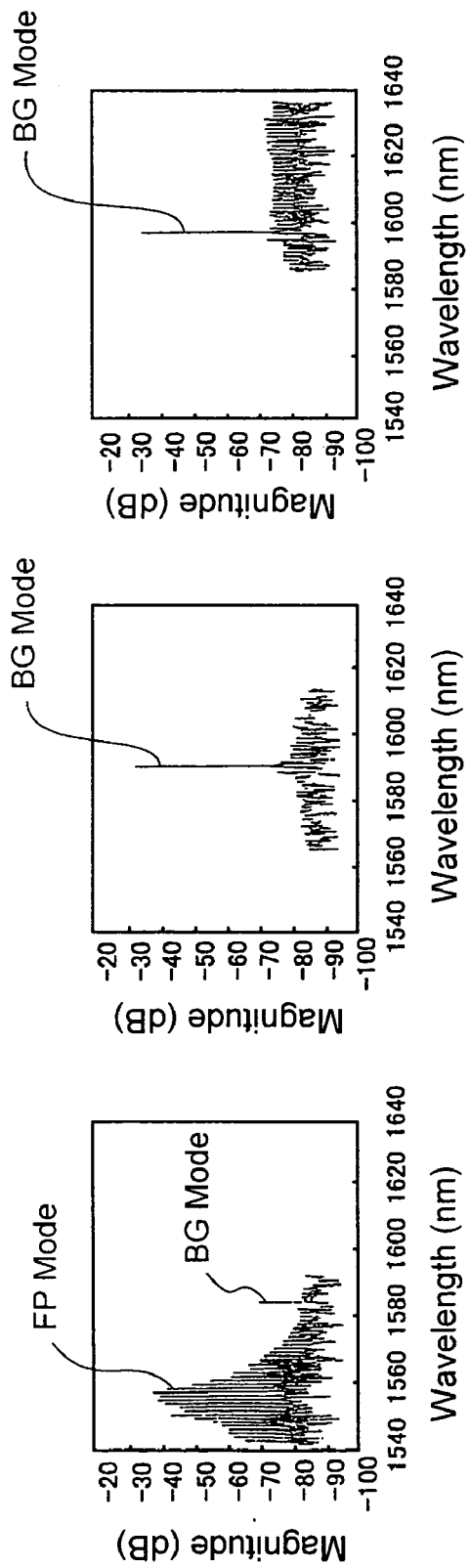

On the other hand, FIGS. from 6A to 6C show the oscillation spectrums of the conventional DFB semiconductor laser at same temperatures as the case in FIG. 5. The conventional DFB laser in FIG. 6 provides the anti-reflective coating with the minimum reflectivity of 0.5% at 1590 nm. Another specifications except for this anti-reflective coating are same as those of the semiconductor laser 10. In the conventional DFB laser in FIG. 6, a numerous number of the FP-mode may oscillate due to the increase of the gain thereof, which results in the poor SMSR.

FIG. 7 is a histogram showing the evaluation result of the SMSR test at low temperatures. Blank bars correspond to the present semiconductor; while hatched bars show the case of the conventional DFB laser. It may be understood that almost all the lasers according to the present invention pass the SMSR test at low temperatures, while the large number of the conventional DFB laser fails the SMSR test.

Although the embodiment thus described is concerning to the DFB laser, the present invention may be also applied to a distributed Bragg Reflector laser (DBR laser) in FIG. 8.

Moreover, the semiconductor laser of the present invention may include an external optical resonator as shown in FIG. 9 and FIG. 10. The semiconductor laser 30 in FIG. 9 and FIG. 10 provide a semiconductor light amplifier 32 and an optical member 34.

The semiconductor light amplifier 32 comprises an active region 12, a light-reflecting surface 16, a light-emitting surface 18 and a pair of electrodes 24. The light-reflecting surface 16 provides a reflection coating 20 thereon. The light-emitting surface provides a specific anti-reflective coating 22 thereon as previously described in the present specification. The light-emitting surface 16 and the light-emitting surface 12 are composed so as to sandwich the active region 12 therebetween.

The optical member 34 optically couples to the semiconductor light amplifier 32. The semiconductor laser shown in FIG. 9 has a grating fiber as the optical member 34. The grating fiber has comprises a core 36 and a clad 38 surrounding the core 36. The Bragg grating 14 is formed in the core 36. The laser shown in FIG. 10 includes a planar light-wave grating as the optical member 34. The planar light-wave grating has the Bragg grating 14 in the core 36 thereof, which is formed in a planar substrate.

Even in such semiconductor laser with the external cavity as shown in FIG. 9 and FIG. 10, the oscillation due to the FP modes can be suppressed by the anti-reflective coating with specific characteristics described in the whole specification of the present application, and the unique longitudinal BG mode oscillation can be obtained in all operation temperatures.

What is claimed is:

1. A semiconductor laser having a distributed feedback grating for emitting light with plural Fabry-Perot modes having a first gain spectrum and a Bragg grating mode having a second gain spectrum, the laser comprising:
   an active region made of a semiconductor material;
   a Bragg grating for defining the Bragg grating mode;
   a light-reflecting surface for reflecting light generated in the active region; and a light-emitting surface with an anti-reflective coating thereon, the light-emitting surface with the anti-reflective coating having a reflectivity, the light-emitting surface and the light-reflecting surface forming a Fabry-Perot resonator combined with the active region for defining the plural Fabry-Perot modes, wherein the reflectivity of the light-emitting surface has a minimum at a wavelength where the first gain spectrum of the Fabry-Perot modes becomes a maximum at temperatures where the maximum of the first gain spectrum of the Fabry-Perot modes is greater than the maximum of the second gain spectrum of the Bragg grating mode.

2. The semiconductor laser according to claim 1 wherein the minimum reflectivity of the light-emitting surface with the anti-reflective coating is smaller than 0.3%.

3. The semiconductor laser according to claim 2, wherein the minimum reflectivity of the light-emitting surface with the anti-reflective coating is smaller than 0.1%.

4. The semiconductor laser according to claim 1, wherein a first wavelength of the Bragg grating mode is greater than a second wavelength where the second gain spectrum of the Fabry-Perot mode becomes the maximum at temperatures where the maximum of the first gain spectrum of the Fabry-Perot modes is greater than the maximum of the second gain spectrum of the Bragg grating mode.

5. The semiconductor laser according to claim 1, wherein a difference between a first wavelength of the Bragg grating mode and a second wavelength where the second gain spectrum of the Fabry-Perot mode becomes the maximum is −7 nm to +8 nm at a room temperature.

6. The semiconductor laser according to claim 1, wherein the temperature where the maximum of the first gain spectrum of the Fabry-Perot modes is greater than the maximum of the second gain spectrum of the Bragg grating mode is −40° C.

7. The semiconductor laser according to claim 1, wherein the active region is made of InGaAsP with a band gap energy corresponding to 1.55 μm wavelength band.

8. A semiconductor laser having a distributed feedback grating for emitting light with plural Fabry-Perot modes and a Bragg grating mode, the laser comprising:

an active region made of InGaAsP for generating luminescence, a Bragg grating for defining the Bragg grating mode;

a light-reflecting surface for reflecting light generated in the active region; and a light-emitting surface providing with an anti-reflective coating thereon, the light-emitting surface with the anti-reflective coating having a reflectivity, the light-emitting surface and the light-reflecting surface forming a Fabry-Perot resonator combined with the active region for defining the plural Fabry-Perot modes, wherein the reflectivity of the light-emitting surface has a minimum at a wavelength 45 nm smaller than a wavelength at which a magnitude of the luminescence from the active region is maximum at a room temperature.

9. The semiconductor laser according to claim 8, wherein the minimum reflectivity of the light-emitting surface with the anti-reflective coating is smaller than 0.3%.

10. The semiconductor laser according to claim 9, wherein the minimum reflectivity of the light-emitting surface with the anti-reflective coating is smaller than 0.1%.

* * * * *